United States Patent [19]
Baeg et al.

[11] Patent Number: 5,754,758
[45] Date of Patent: May 19, 1998

[54] SERIAL MEMORY INTERFACE USING INTERLACED SCAN

[75] Inventors: Sang-Hyeon Baeg; Heon-cheol Kim, both of Kyungki-do; Ho-royng Kim, Seoul; Chang-hyun Cho, Kyungki-do, all of Rep. of Korea

[73] Assignee: Samsung Electronics Co., Ltd., Kyungki-Do, Rep. of Korea

[21] Appl. No.: 638,372

[22] Filed: Apr. 26, 1996

[30] Foreign Application Priority Data

Apr. 27, 1995 [KR] Rep. of Korea ............... 1995-10092

[51] Int. Cl.⁶ ............... G01R 31/28; G06F 11/22
[52] U.S. Cl. ............... 395/183.06; 371/22.32; 371/22.33
[58] Field of Search ............... 395/200.09, 595, 395/183.06, 843; 371/22.3, 22.5, 22.1, 22.32, 22.6; 364/489, 490, DIG. 1, DIG. 2, 717.01

[56] References Cited

U.S. PATENT DOCUMENTS

| | | | |
|---|---|---|---|
| 4,733,405 | 3/1988 | Shimizume et al. | 377/29 |
| 4,969,148 | 11/1990 | Nadeau-Dostie et al. | 371/21.1 |
| 5,469,445 | 11/1995 | Nicolaidis | 371/22.3 |
| 5,621,740 | 4/1997 | Kamada | 371/22.3 |

OTHER PUBLICATIONS

Benoit Nadeau–Dostie et al., "Serial Interfacing for Embedded–Memory Testing", IEEE Design & Test of Computer, 1990, pp. 2–13.

*Primary Examiner*—Daniel H. Pan
*Attorney, Agent, or Firm*—Cushman Darby & Cushman IP Group of Pillsbury Madison & Sutro LLP

[57] ABSTRACT

A serial memory interface includes a register having a plurality of flip-flops forming a scan chain and coupled to both the input and output terminals of memory cells. An interlaced scan is established by interconnecting scan chains between multiple memory blocks. The interface structure provides a means for efficiently performing a built-in self test of an embedded memory while requiring minimal overhead in hardware structure.

12 Claims, 3 Drawing Sheets

SERIAL MEMORY INTERFACE USING INTERLACED SCAN

BACKGROUND OF THE INVENTION (1) Field of the Invention

The present invention relates to a serial memory interface, and more particularly, to a structure which provides a serial interface between an embedded memory and a built-in self test (BIST) logic for testing the embedded memory using an interlaced scan.

(2) Description of Related Art

In various types of microprocessors, for example, specialized processors for performing digital signal processing operations (DSP chips), embedded memories having various sizes are commonly included within the chips. As circuit integration increases due to the development of submicron processing technology, testing these embedded memories becomes increasingly difficult. Moreover, such tests are prohibitively time-consuming due to the various kinds of errors that can occur and which must be accounted for during testing.

BIST techniques are conventionally used to test embedded memories. According to this technique, testing logic is built on the chip to intrinsically test the embedded memory. This technique is popular because the structure required to implement the test is simple and only a small amount of additional hardware is required, compared to that required in BIST structures for testing logic circuits.

Two conventional techniques which provide an interface with the BIST logic for testing embedded memories are described in:

(1) Benoit Nadeau-Dostie, Allan Silburt, Vinod K. Agarwal, "Serial Interfacing For Embedded-Memory Testing," IEEE Design & Test of Computers, pp. 52–63, 1990.

(2) "Serial Testing Technique For Embedded Memories," U.S. Pat. No. 4,969,148, issued Nov. 6, 1990.

FIG. 1 shows a configuration of a memory to be tested and its peripheral parts, including a memory block 10, an input terminal 20, and an output terminal 22, each terminal being connected to respective logic blocks 16 and 18. Each terminal further comprises a register (12 and 14) for communicating with a corresponding logic block, such that it is possible to communicate signals between the memory and logic blocks in a stabilized manner and to achieve high speed signal processing.

The operations of the conventional techniques used to provide an interface between embedded memories and the BIST logic are described below with reference to the annexed drawings.

FIG. 2 is a block diagram of a conventional serial memory interface using a multiplexer (MUX) components, where each word of the memory is comprised of three cells, Cell0, Cell1, and Cell2 (3 bits). For ease of illustration, only the nth word 32 of the memory is shown. I0, I1, and I2 are the input terminals for the three cells and O0, O1, and O2 are the output terminals.

The MUX logic 30 is used to provide a serial interface between the memory and a BIST controller (not shown), whereby information being read from the memory can be re-written into the memory. For example, a signal O1 from the second memory cell (Cell1) is input to the next cell (Cell2) through the MUX 30, with the result that the second memory cell (Cell1) and the third memory cell (Cell2) are interconnected during a test mode (enabled by the signal TEST_MODE). A test pattern signal (TEST_IN) is input from the BIST controller (not shown) and an output (TEST_OUT) from the last cell (Cell2 in FIG. 2) is input to the BIST controller.

A problem with the above-described serial interface, however, is that additional MUX logic is required for every memory bit line.

FIG. 3 shows another conventional serial memory interface for performing a BIST operation, wherein a scan chain is used to interface with a memory in a serial mode and flip-flops (not shown) are constructed around the memory to implement the scan chain. The object of the scan chain is to isolate the memory from the surrounding logic blocks, thereby improving the observability of logic blocks connected to the memory.

With this conventional technique, however, both of the input and output registers 12 and 14 are serially connected to the scan chain. Therefore, in order to read SCAN_IN data stored in the registers from the memory and then re-read the data via SCAN_OUT through the scan chain, a clock cycle of sufficient duration to serially throughput a number of bits equal to the width of the memory is required for each read operation. Consequently, this technique is very inefficient for high speed testing.

SUMMARY OF THE INVENTION

It is, therefore, an object of the present invention to provide a serial memory interface for testing an embedded memory which overcomes the above-mentioned problems of the conventional techniques.

It is another object of the present invention to provide a serial memory interface which does not require the use of additional MUX logic in accordance with the number of bit lines in the memory.

It is another object of the present invention to provide a serial memory interface which enables high speed testing of an embedded memory.

It is another object of the present invention to provide a serial memory interface which effectively isolates surrounding logic blocks from an embedded memory during a BIST operation.

In order to achieve these and other objects, a serial memory interface according to the present invention includes a register having a plurality of flip-flops forming a scan chain and coupled to both the input and output terminals of memory cells. An interlaced scan is established by interconnecting scan chains between multiple memory blocks. The interface structure efficiently performs a built-in self test of an embedded memory while requiring minimal overhead in hardware structure.

BRIEF DESCRIPTION OF THE DRAWINGS

These and other advantages of the present invention will become better understood in the following detailed description taken in conjunction with the accompanying drawings in which.

DETAILED DESCRIPTION OF THE PREFERRED EMBODIMENTS

With reference to the annexed drawings, the preferred embodiments of the present invention are described in detail as follows.

Figure 1:
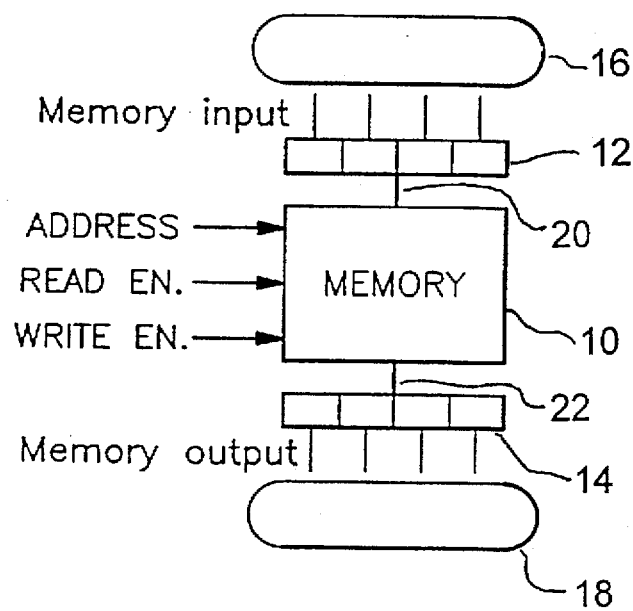
FIG. 1 is a block diagram showing a memory to be tested and the peripherals thereof.
Figure 2:
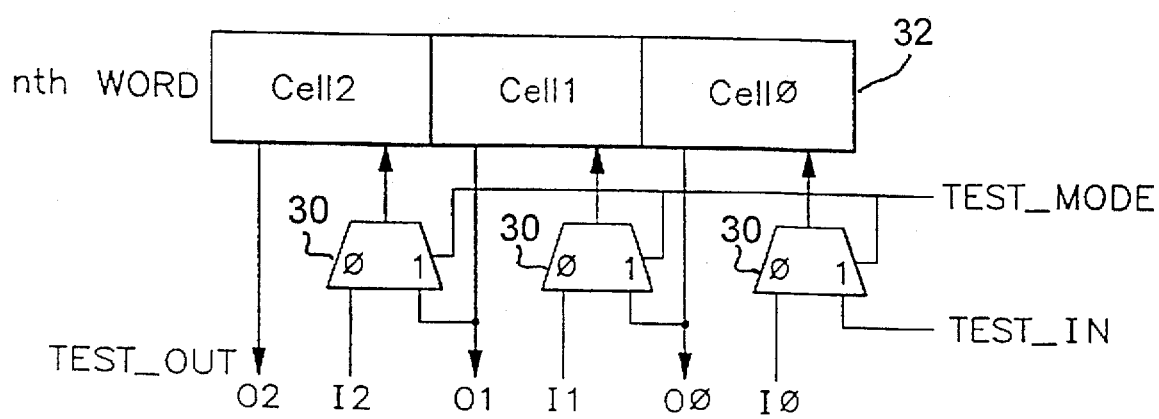
FIG. 2 is a block diagram of a conventional serial memory interface using a multiplexer.
Figure 3:
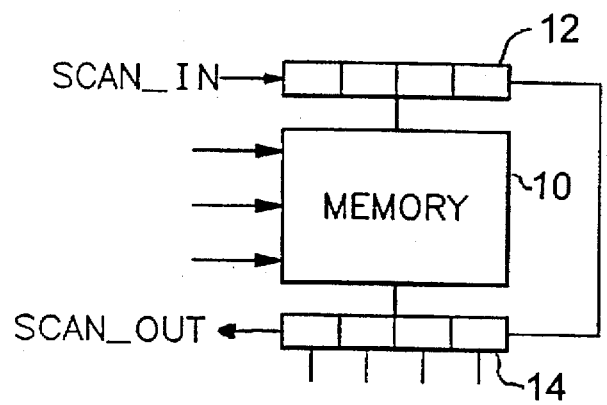
FIG. 3 is a block diagram of a conventional scan chain used to isolate the peripherals of a memory in a serial mode.
Figure 4:
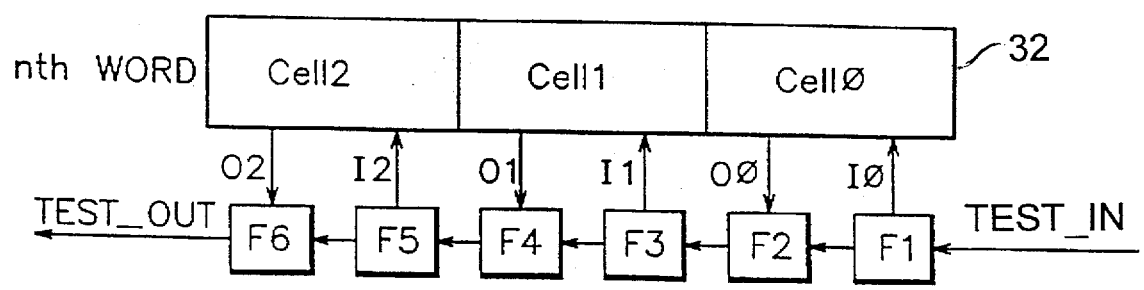
FIG. 4 illustrates an embodiment according to the present invention, wherein a serial memory interface is achieved using an interlaced scan.

An embodiment according to the present invention is shown in FIG. 4. A first flip-flop (F1) receives a TEST_IN signal and a first memory cell (Cell0) outputs data O0 after receiving data I0 from the first flip-flop (F1). A second flip-flop (F2) receives output from both of the first flip-flop (F1) and the first memory cell (Cell0). A third flip-flop (F3) receives output from the second flip-flop (F2). A second memory cell (Cell1) outputs data O1 after receiving data I1 from the third flip-flop (F3). A fourth flip-flop (F4) outputs data after receiving output from both the third flip-flop (F3) and the second memory cell (Cell1). A fifth flip-flop (F5) receives output from the fourth flip-flop (F4). A third memory cell (Cell2) outputs data O2 after receiving input data I2 from the fifth flip-flop (F5). A sixth flip-flop (F6) outputs a TEST_OUT signal after receiving output from both the fifth flip-flop (F5) and the third memory cell (Cell2).

The structure of FIG. 4 therefore provides a serial interface with a memory (Cell0–Cell2) for use during both normal and test operations. Flip-flops F1 to F6 comprise a register connected to the input and output terminals of each cell. The structure also provides a scan chain, wherein flip-flops from F1 to F6 exchange data with the cells.

For example, data in the second memory cell (Cell1) is read and transferred by means of the scan chain through the fourth flip-flop (F4) to the fifth flip-flop (F5) positioned at the input terminal of the third memory cell (Cell2). The data from the fifth flip-flop (F5) is then transferred to the third memory cell (Cell2) resulting in a connection between the second memory cell (Cell1) and the third memory cell (Cell2) by means of the scan chain. An interlaced scan can thereby be constructed by adjusting the number of flip-flops in proportion to the size of the memory, wherein the flip-flops are called scan flip-flops or clocked scan cells.

During normal operations (when TEST_MODE is 0), input data and a clock signal are transferred through the input terminal. During a scan operation, scan-in data and another clock signal are transferred through the terminal. An interlaced scan chain is established by interconnecting a scan-out terminal to the next scan-in terminal.

Based on the scan chain structure memory interface shown in FIG. 4, operational steps are listed in the following table to illustrate how a value is recorded into a word of a memory by means of controlling only one data-line (TEST_IN). An initial value of the memory is assumed to be "XXX".

TABLE 1

| OPERATION | TEST IN | REGISTER | MEMORY | TEST OUT |
|---|---|---|---|---|
| INITIAL | X | XXXXXX | XXX | X |
| SHIFT | 0 | 0XXXXX | XXX | X |
| WRITE | 0 | 0XXXXX | 0XX | X |
| READ | 0 | 00XXXX | 0XX | X |

TABLE 1-continued

| OPERATION | TEST IN | REGISTER | MEMORY | TEST OUT |
|---|---|---|---|---|
| SHIFT | 0 | 000XXX | 0XX | X |
| WRITE | 0 | 000XXX | 00X | X |
| READ | 0 | 0000XX | 00X | X |
| SHIFT | 0 | 00000X | 000 | X |
| WRITE | 0 | 00000X | 000 | X |
| READ | 0 | 000000 | 000 | 0 |

In the table, the contents of REGISTER and MEMORY indicate an end state after the indicated OPERATION. Control signals toward the memory are shown in the lines of READ and WRITE, and control signals toward the input register are shown in the line of SHIFT. Also in the table, the first binary value of REGISTER is equivalent to the first flip-flop in FIG. 4. The first value of MEMORY is equivalent to the first memory cell (Cell0) and the rest of the values are addressed consecutively. As seen from the table, data in an embedded memory is serially recorded from the first memory cell up to the final memory cell by controlling the input TEST_IN only, and in this way any arbitrary value can be recorded in a memory.

Figure 5:
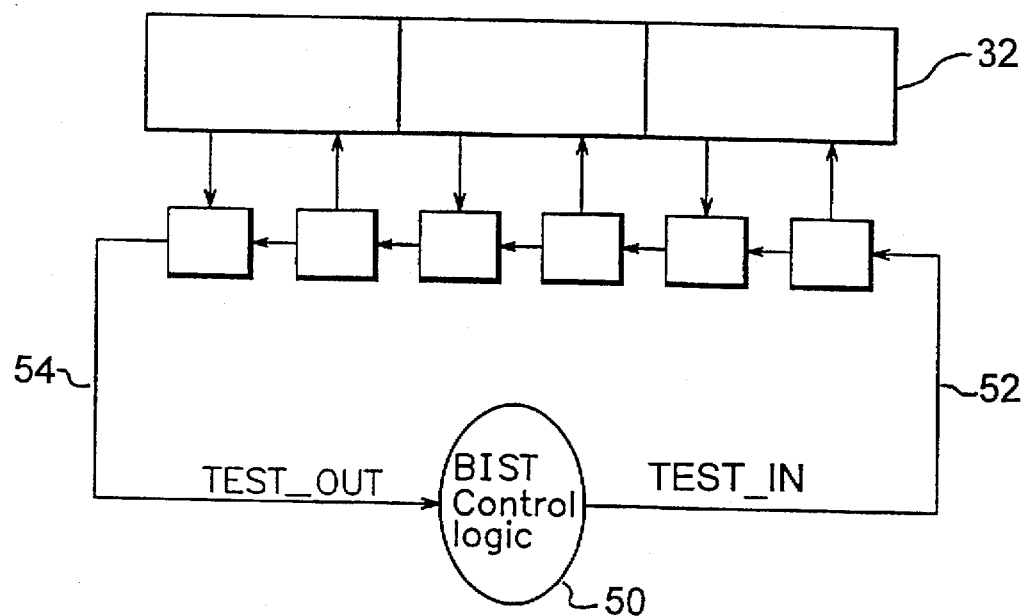
FIG. 5 illustrates another embodiment according to the present invention, wherein a memory is serially interfaced with a built-in self test (BIST) logic using an interlaced scan.

FIG. 5 shows another embodiment according to the present invention, wherein a BIST control logic is serially interfaced with a memory using an interlaced scan.

The BIST control logic 50 provides test patterns to the memory through a single input line 52, and compares predicted values with the actual data output from the memory through a single output line 54. Accordingly, the BIST control logic 50 communicates with the memory using only two lines, independent of the bit width of the memory.

Figure 6:
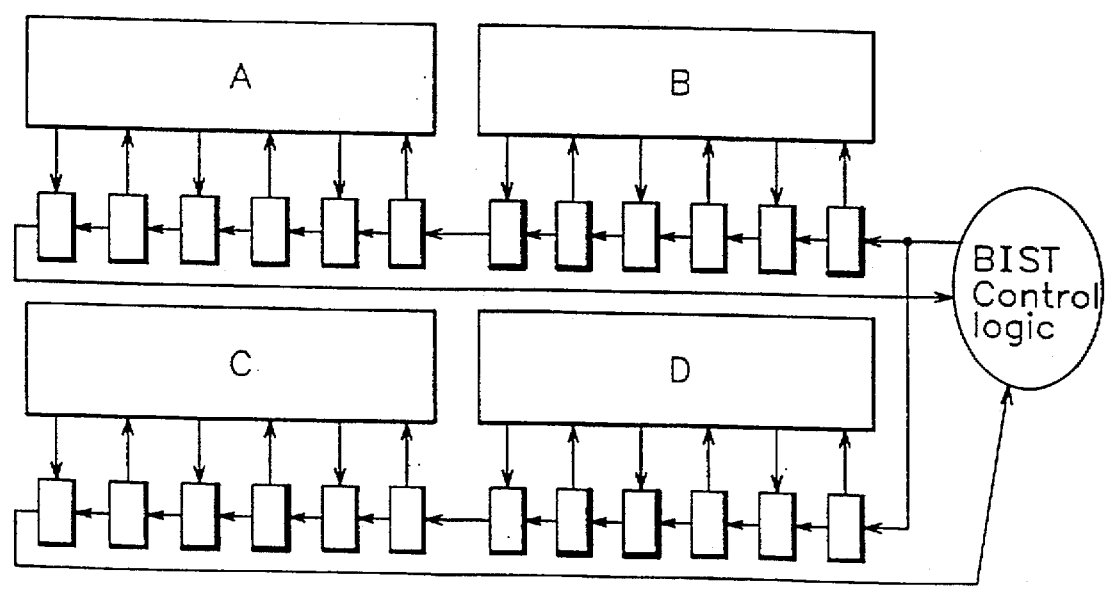
FIG. 6 illustrates a further embodiment according to the present invention, wherein multiple memories are serially interfaced with the BIST logic using an interlaced scan.

FIG. 6 shows yet another embodiment according to the present invention, wherein multiple memories are serially interfaced with the BIST control logic 50 by means of an interlaced scan. When the plurality of memories are implemented in a chip as shown in FIG. 6, the BIST logic is constructed either in a serial or a parallel mode by connecting two of the memories with input and output registers comprised in an interlaced scan. For example, memory A and memory B can be tested as a single memory when the SCAN_OUT terminal of memory A and the SCAN_IN terminal of memory B are interconnected. Since all of the test vectors generated by the BIST control logic are loaded on the input/output registers of memory A and memory B, it takes twice as long to test such a connected configuration compared to testing each memory separately.

On the other hand, when the two sets of blocks, memory A-memory B and memory C-memory D, are constructed in a parallel structure and both blocks tested simultaneously, it takes the same time to test them as required for testing a single block separately. If all four memories are constructed in parallel, testing all four takes the same time as required for a single memory.

As described in the embodiments of the present invention, an embedded memory can be serially interfaced using an interlaced scan which not only has an advantage of small overhead in view of hardware, but also eliminates additional delay during normal operation (when TEST_MODE is 0), unlike conventional techniques wherein delays are caused by multiplexer logic inserted between a memory and its input terminals.

The above-described advantages of the present invention can be obtained in many kinds of integrated circuit chips where SRAM is embedded.

Although the present invention has been herein described with reference to the preferred embodiments thereof, those skilled in the art will readily appreciate that various substitutions and modifications can be made thereto without departing from the spirit and scope of the appended claims.

What is claimed is:

1. A serial interface for a memory having a word size of at least three cells, each cell having a cell input and a cell output, said serial interface comprising:

a first flip-flop which receives an input data signal at a first flip-flop input and which has a first flip-flop output coupled to a first cell input;

a second flip-flop which has a second flip-flop input coupled to a first cell output and said first flip-flop output, and which has a second flip-flop output;

a third flip-flop which has a third flip-flop input coupled to said second flip-flop output and which has a third flip-flop output coupled to a second cell input;

a fourth flip-flop which has a fourth flip-flop input coupled to a second cell output and said third flip-flop output, and which has a fourth flip-flop output;

a fifth flip-flop which has a fifth flip-flop input coupled to said fourth flip-flop output and which has a fifth flip-flop output coupled to a third cell input; and a sixth flip-flop which has a sixth flip-flop input coupled to a third cell output and said fifth flip-flop output, and which supplies an output data signal at a sixth flip-flop output.

2. The serial memory interface according to claim 1, wherein said flip-flops define a scan chain.

3. The serial memory interface according to claim 2, wherein said flip-flops are clocked scan cells.

4. The serial memory interface according to claim 1, wherein an external test circuit supplies said input data signal and receives said output data signal during a test operation.

5. The serial memory interface according to claim 1, wherein:

said sixth flip-flop receives an output from said fifth flip-flop, said fifth flip-flop receives an output from said fourth flip-flop, said fourth flip-flop receives an output from said third flip-flop, from said flip-flop receives an output from said second flip-flop, and said second flip-flop receives an output from said first flip-flop in response to a control signal simultaneously supplied to each of said flip-flops, said first cell input receives an output from said first flip-flop, said second cell input receives an output from said third flip-flop, and said third cell input receives an output from said fifth flip-flop in response to a write control signal supplied to said memory, and said second flip-flop receives an output from said first cell output, said fourth flip-flop receives an output from said second cell output, and said sixth flip-flop receives an output from said third cell output in response to a read control signal supplied to said memory.

6. The serial memory interface according to claim 5, wherein said flip-flops define a scan chain.

7. The serial memory interface according to claim 6, wherein said flip-flops are clocked scan cells.

8. The serial memory interface according to claim 5, wherein an external test circuit supplies said input data signal and receives said output data signal during a test operation.

9. A serial interface for a memory having first and second memory blocks, both memory blocks having a word size of at least three cells, each cell having a cell input and a cell output, said serial interface comprising:

first and second registers respectively coupled to said first and second memory blocks, both of said registers including:

a first flip-flop which receives an input data signal at a first flip-flop input and which has a first flip-flop output coupled to a first cell input;

a second flip-flop which has a second flip-flop input coupled to a first cell output and said first flip-flop output, and which has a second flip-flop output;

a third flip-flop which has a third flip-flop input coupled to said second flip-flop output and which has a third flip-flop output coupled to a second cell input;

a fourth flip-flop which has a fourth flip-flop input coupled to a second cell output and said third flip-flop output, and which has a fourth flip-flop output;

a fifth flip-flop which has a fifth flip-flop input coupled to said fourth flip-flop output and which has a fifth flip-flop output coupled to a third cell input; and a sixth flip-flop which has a sixth flip-flop input coupled to a third cell output and said fifth flip-flop output, and which supplies an output data signal at a sixth flip-flop output, said output data signal of said first register being supplied as said input data signal of said second register.

10. The serial memory interface according to claim 9, wherein an external test circuit supplies said input data signal of said register of said first memory block and receives said output data signal of said register of said second memory block during a test operation.

11. A serial interface for a memory having first and second memory blocks, both memory blocks having a word size of at least three cells, each cell having a cell input and a cell output, said serial interface comprising:

first and second registers respectively coupled to said first and second memory blocks, each of said registers including:

a first flip-flop which receives an input data signal at a first flip-flop input and which has a first flip-flop output coupled to a first cell input;

a second flip-flop which has a second flip-flop input coupled to a first cell output and said first flip-flop output, and which has a second flip-flop output;

a third flip-flop which has a third flip-flop input coupled to said second flip-flop output and which has a third flip-flop output coupled to a second cell input;

a fourth flip-flop which has a fourth flip-flop input coupled to a second cell output and said third flip-flop output, and which has a fourth flip-flop output;

a fifth flip-flop which has a fifth flip-flop input coupled to said fourth flip-flop output and which has a fifth flip-flop output coupled to a third cell input; and a sixth flip-flop which has a sixth flip-flop input coupled to a third cell output and said fifth flip-flop output, and which supplies an output data signal at a sixth flip-flop output, said input data signal of said first and second registers being commonly supplied by an external source.

12. The serial memory interface according to claim 11, wherein an external test circuit commonly supplies said input data signal of said registers of said first and second memory blocks and receives said output data signals of said registers of said first and second memory blocks during a test operation.

* * * * *